US006538296B1

(12) United States Patent
Wan

(10) Patent No.: US 6,538,296 B1
(45) Date of Patent: Mar. 25, 2003

(54) MICRO-ELECTRO MECHANICAL DEVICE MADE FROM MONO-CRYSTALLINE SILICON AND METHOD OF MANUFACTURE THEREFORE

(76) Inventor: Chang-Feng Wan, 16210 Shadybank Dr., Dallas, TX (US) 75248

( * ) Notice: Subject to any disclaimer, the term of this patent is extended or adjusted under 35 U.S.C. 154(b) by 0 days.

(21) Appl. No.: 09/461,018

(22) Filed: Dec. 15, 1999

Related U.S. Application Data

(62) Division of application No. 09/211,486, filed on Dec. 11, 1998.

(51) Int. Cl.[7] .............................................. H01L 29/82
(52) U.S. Cl. ...................................... 257/415; 257/417
(58) Field of Search ................................ 257/415, 417, 257/254, 275, 783

(56) References Cited

U.S. PATENT DOCUMENTS

| 5,313,832 A | * | 5/1994 | Stephan et al. ............... 73/204 |
| 5,314,572 A | | 5/1994 | Core et al. .................. 156/643 |
| 5,576,250 A | | 11/1996 | Diem et al. .................. 437/228 |
| 5,710,057 A | | 1/1998 | Kenney ....................... 437/62 |
| 5,723,894 A | * | 3/1998 | Ueno .......................... 257/415 |
| 5,725,729 A | | 3/1998 | Greiff ....................... 156/657.1 |
| 5,780,885 A | * | 7/1998 | Diem et al. .................. 257/254 |
| 6,159,385 A | * | 12/2000 | Yao et al. ....................... 216/2 |
| 6,164,759 A | * | 12/2000 | Fujii et al. .................... 347/54 |
| 6,201,284 B1 | * | 3/2001 | Hirata et al. ................. 257/415 |

* cited by examiner

Primary Examiner—Phat X. Cao
(74) Attorney, Agent, or Firm—James S. Finn, Esq.

(57) ABSTRACT

A micro-electro-mechanical device and method of manufacture therefore with a suspended structure formed from mono-crystalline silicon, bonded to a substrate wafer with an organic adhesive layer serving as support and spacer and the rest of the organic adhesive layer serving as a sacrificial layer, which is removed by a dry etch means. Said substrate wafer may contain integrated circuits for sensing and controlling the device.

1 Claim, 2 Drawing Sheets

MICRO-ELECTRO MECHANICAL DEVICE MADE FROM MONO-CRYSTALLINE SILICON AND METHOD OF MANUFACTURE THEREFORE

BACKGROUND OF THE INVENTION

1. Technical Field of the Invention

The present invention is related to a micro-electro-mechanical device. In particular, the present invention relates to a micro-electro-mechanical device with a suspended structure formed from mono-crystalline silicon, bonded to a substrate wafer with an organic adhesive layer. Still more particularly, the present invention has part of said organic adhesive layer serving as support and spacer and the rest of said organic adhesive layer serving as a sacrificial layer, which is removed by a dry etch means. Even more particularly, the substrate wafer may contain integrated circuits for sensing and controlling said device.

2. Description of the Related Art

A micro-electro-mechanical system (MEMS) is a device that transforms mechanical activity into electrical signals and vice versa. A key element in MEMS is a suspended microstructure, which deflects in response to applied force to the microstructure or to a proof mass attached to it. The amount of deflection can be sensed electrically by capacitive plates coupled to surfaces of both the suspended mass and an adjacent structure or by piezoelectric or piezo-resistive layers formed on the microstructure. As the suspended mass deflects, the resulting change in capacitance or voltage from the sensing elements provides an electrical indication of the applied force. One example is an accelerometer that comprises a rectangular membrane, one side of which is fixed to a carrier while the other is suspended, and a means for detecting the movement of the membrane under the effect of acceleration. This constitutes a force sensor. Conversely, an electrical signal applied to the capacitive plates or piezo-electric layers can result in deflection in the suspended mass. This constitutes an actuator.

There are two major classifications of methods for making thin suspended microstructures: (1) Bulk micro-machining, where the transducers are primarily shaped by etching a thick mono-crystalline silicon substrate; and (2) Surface micro-machining, where transducers are constructed entirely from thin films deposited on respective sacrificial layers. Mono-crystalline silicon used in bulk micro-machining has two major benefits. The first benefit is the silicon is almost a perfect mechanical material. It's stronger than steel by weight; does not show mechanical hysteresis and is highly sensitive to stress. This technology requires a deep silicon etch to remove the bulk of the material to form the microstructures. This is normally by anisotropic wet etch where both dimension control and contamination control is a major challenge. An important feature of bulk micro-machining is the microstructure is often bonded to another wafer for packaging. The bonding techniques include anodic bonding, metallic seals, and low-temperature glass bonding. Polymer bonding is attractive because it is widely used in attaching semiconductor dies to substrates for packaging, but it is rarely used in micro-machining as most these applications require very thin bondlines. The application of a thin layer of polymer adhesive requires thinning with solvent that is incompatible with most micro-machining techniques.

Surface micro-machined MEMS devices are constructed entirely from thin films deposited on a sacrificial layer. These devices allow for monolithic integration with silicon processors using the standard silicon process technology commonly known to individuals skilled in the art. The sacrificial layer is either made of organic polymer such as photoresist or inorganic substance such as silicon oxide. Photoresist can be dry etched in oxygen plasma but can not withstand high temperature anneal like silicon dioxide can. Chemical-vapor deposited polysilicon film is used in integrated accelerometers and many other MEMS devices. Unfortunately, it must be annealed at a high temperature (~1000° C.) to reduce stress, or its suspended structure will curl after the sacrificial layer is removed from underneath. The sacrificial layer is made of silicon dioxide whose removal is by wet etch in HF acid. Surface tension of the aqueous HF acid solution exerts forces on the suspended microstructure, which pulls the microstructure into contact with the substrate and causes them to stick together. To separate them without causing damages is difficult because the combination of adhesive forces and electrostatic forces is large compared to the strength of the thin films. Another drawback is the metal interconnect in the integrated control circuits can not withstand the high temperature anneal. Therefore, it must be formed after the polysilicon suspended microstructure is formed. Protecting the suspended microstructure during interconnect process and the wet etch is a complex matter and entails the usage of costly state-of-the-art fabrication facilities.

Surface micro-machining that does not require high temperature anneal has distinct advantages because dry etch can be used for removing the sacrificial layer and the microstructure can be fabricated on finished IC's. This avoids the sticking associated with the wet etch process and the expensive equipment thereby necessitated. However, the intrinsic stress and hysteresis in the deposited film limits its thickness to a few thousand angstroms or the films can curl and change after stressing. This makes the technique not suitable for devices such as accelerometers that require larger proof mass.

Therefore, it is highly desirable to combine the merits of both bulk and surface micro-machining techniques—such as MEMS devices employing suspended structure made from mono-crystalline silicon by surface micro-machining method. One example is surface micro-machined accelerometers made with silicon-on-insulator (SOI) wafers, wherein thick mono-crystalline silicon is bonded to another silicon wafer with silicon oxide insulator in between. The suspended structure can be made much thicker than mono-crystalline for increased proof mass. However, SOI wafers are much more expensive than the regular wafers and its production employs a high temperature process that is not compatible with integrated circuits and dry-etchable sacrificial layers. It would be of great advantage if the sacrificial layer were dry-etchable like organic polymers. Hence, there is a strong need in the industry to overcome the aforementioned shortcomings of the present art.

SUMMARY OF THE INVENTION

It is therefore one object of the present invention to provide an improved micro-electro-mechanical device and method of manufacture therefore with a monolithic unitary structure of micro-sensors and integrated circuits;

It is another object of the present invention to provide an improved micro-electro-mechanical device and method of manufacture therefore which allows for the fabrication of the suspended microstructures by dry etching;

It is another object of the present invention to provide an improved micro-electro-mechanical device which has low temperature processing, thereby allowing for the use of wafers with pre-selected integrated circuits as a substrate;

It is yet another object of the present invention to provide an improved micro-electro-mechanical device which allows for large proof mass from thick, low stress, mono-crystalline-silicon film for high sensitivity.

The above and other objects are achieved as is now described. A micro-electro-mechanical device with a suspended structure is formed from mono-crystalline silicon, bonded to a substrate wafer with an organic adhesive layer, wherein part of the organic adhesive layer serves as support and spacer and the rest of the organic adhesive layer serves as a sacrificial layer. The fabrication is completed with a monolithic surface micro-machining technique and said sacrificed organic adhesive layer is removed by a dry etch means.

BRIEF DESCRIPTION OF THE DRAWINGS

The novel features believed characteristic of this invention are set forth in the appended claims. The invention itself, however, as well as a preferred mode of use, further objects, and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
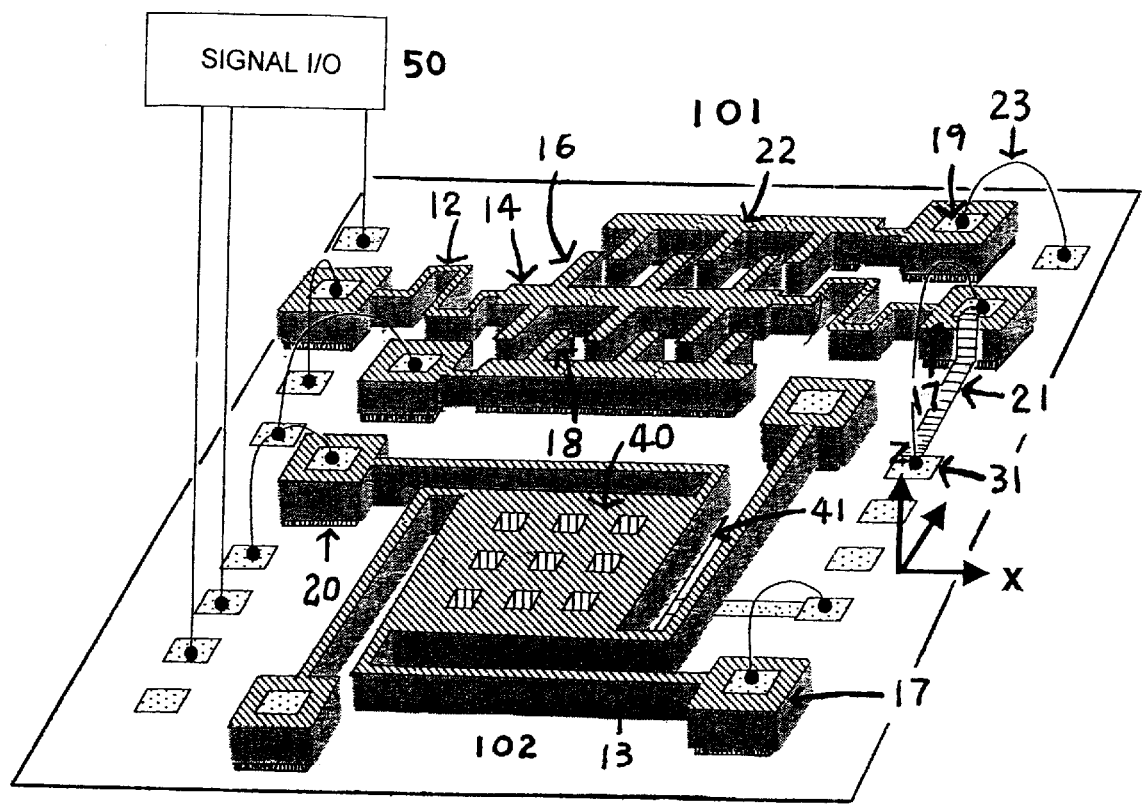
FIG. 1 is a perspective view of the accelerometer embodiment of the present invention.

Reference is now made to FIG. 1, wherein the accelerometer embodiment of the present invention is depicted. This accelerometer MEMS device has an x-axis accelerometer 101 and a z-axis accelerometer 102 and a substrate 30. The accelerometers are fabricated from a doped mono-crystalline silicon wafer. The substrate comprises passive or active electrical components such as signal processing circuitry, electrical connections, and capacitive plates. The substrate, if conductive, may also be used as a capacitive plate. The x-axis accelerometer 101 defines (1) a suspended structure comprising central beam 14, a plurality of suspended fingers 16 extending transversely therefrom, two narrow, meandering springs 12, and pads 17, which are bonded to the substrate with a thin layer of organic adhesive 20; (2) a stationary structure comprising two side beams 22, a plurality of stationary fingers 18 extending transversely therefrom that are positioned parallel and adjacent to each said suspended fingers 16. The side beams 22 are also bonded to the substrate with adhesive layer 20. All said fingers and beams are electrically conductive because of doped silicon therein. When the stationary fingers 18 are charged to a different voltage than the suspended bridge, a capacitive voltage exists between each stationary finger and its adjacent bridge finger. When there is acceleration along the x-axis, the suspended beam 14 and fingers 16 move relative to the stationary fingers 18, resulting in a change in the capacitive voltage, which measures the acceleration in the x-axis.

A similarly configured accelerometer oriented along the y-axis can be used for measuring acceleration in the y-direction. The z-axis accelerometer 102 comprises a central plate 40 that are suspended by four long, narrow beams 13 from pads 17. When the central plate is charged to a different voltage than the substrate or a stationary conductive plate 41 on the substrate positioned below the suspended plate 40, a capacitive voltage exits between them. When the accelerometer 102 is subjected to acceleration along the z-axis, the suspended plate 40 moves relative to the stationary plate 41, resulting in a change in the capacitive voltage from which the z-axis acceleration can be measured.

Referring now to FIGS. 2 to 5, there is depicted cross-sectional side views showing a particular portion of a microstructure during specific phases of the fabrication process. The fingers and gaps are not shown to scale.

Figure 2:
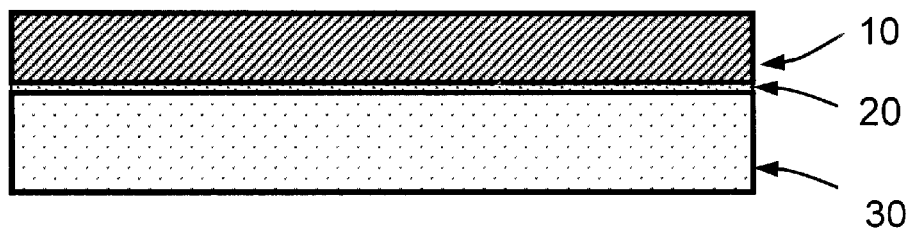
FIG. 2 is a cross-sectional view of the first stage of production of the accelerometer of FIG. 1.

FIG. 2 is a cross sectional side view of a silicon wafer 10 bonded to a substrate wafer 30 with an organic adhesive layer 20. The substrate wafer may contain circuitry, which is not shown. To reach this stage of process, a layer of organic adhesive is applied on one side of one or both substrate and silicon wafers. The adhesive can be either thermoplastic adhesives (e.g. wax) or thermoset (e.g. epoxy). Epoxy is more robust as it can be cured to form a tight, cross-linked structure marked by toughness and high temperature resistance upon exposure to heat or light and addition of a curing agent. A preferred method for applying the adhesive is spin coating similar to that used for coating photoresist as it provides uniform coating and the epoxy thickness can be adjusted by varying spin speed and viscosity of the uncured epoxy. Spin coating is commonly used in the art of integrated circuit manufacture.

This is important in setting the reference capacitive voltage in the z-axis accelerometer. Viscosity of the epoxy is adjusted by adding solvents. The spin coating process spreads the epoxy over the wafers and partially dries it. A moderate bake further dries the epoxy and converts it into B-stage, which is where it partially cures and turns from liquid to a solid form. This is important to prevent the epoxy from flowing. Care must be taken not to allow an excessive amount of residual solvent to be sealed in the bondline as this leads to formation of micro-voids when heated.

Figure 3:
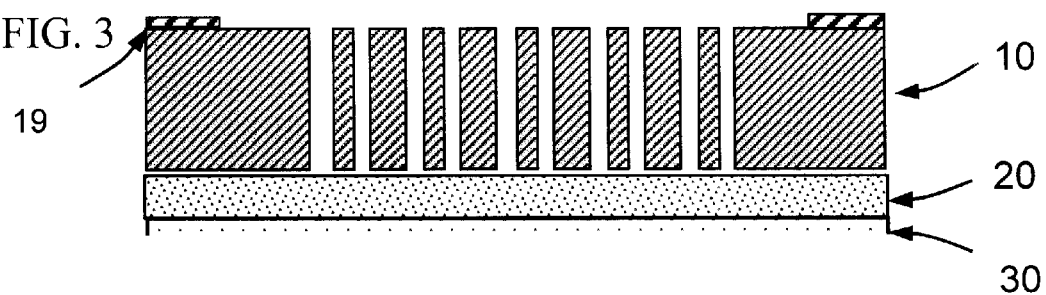
FIG. 3 is a cross-sectional view of the second stage of production of the accelerometer of FIG. 1.

Next the coated sides of the two wafers are brought into contact with each other in a press, wherein pressure and heat are applied under a vacuum. Heating softens the B-staged epoxy, restores its tackiness for bonding and subsequently cures it. Heating facilitates the bonding process and cures the epoxy, while the vacuum eliminates gas bubbles in the bondline. Gas bubbles and micro-voids are detrimental in the subsequent thinning of the top wafer because they create dents on the surface. After the wafers are bonded, the top wafer is thinned to the desired thickness, and contacts 19 (FIG. 3) are formed before photoresist pattern is formed on the top wafer and etched. FIG. 3 is a cross sectional side view of the structure at this stage of process.

Figure 4:
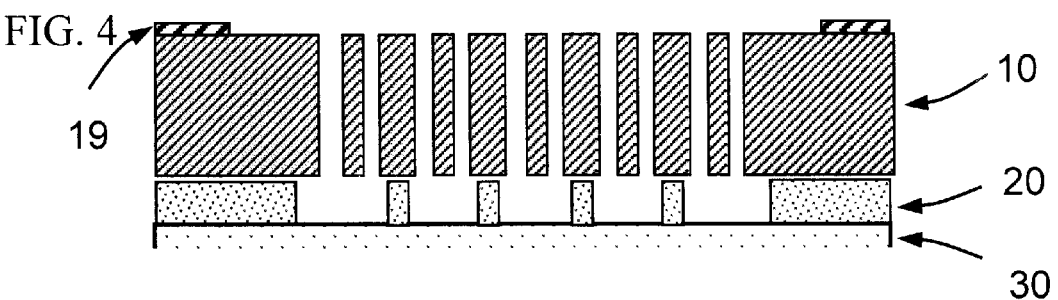
FIG. 4 is a cross-sectional view of the third stage of production of the accelerometer of FIG. 1.
Figure 5:
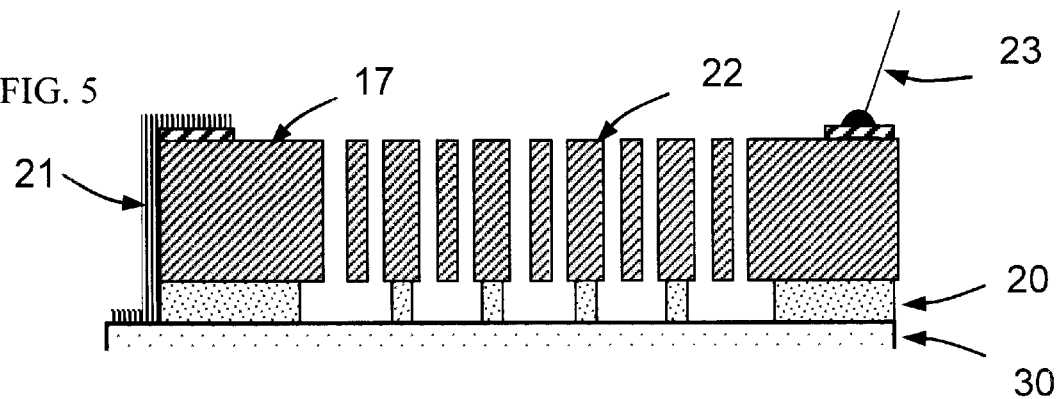
FIG. 5 is a cross-sectional view of the fourth stage of production of the accelerometer of FIG. 1.

Next an oxygen plasma etch is used to selectively etch the epoxy until narrow structures are totally undercut and suspended, while wider structures such as beams 22 and pads 17 remain bonded to the substrate as shown in FIG. 4. Finally, electrical connections are made between contacts 3 and 19 in form of bond wire 23 or patterned metal stripe 21 as shown in FIG. 5.

In addition to accelerometers, the present microstructure can be used for light valves or actuators. For example, if a voltage is applied to capacitive metal plate 40, the suspended plate 10 can move or rotate according to the applied voltage and configuration of the springs. An incident light is reflected in a different direction or phase according to the movement of the suspended structure. Similarly, the movement can actuate other mechanisms to constitute an actuator. Additionally, the present microstructure is not limited to one layer of mono-crystalline silicon 10. More layers of silicon can be bonded to the existing layer to constitute a multi-layered structure for more sophisticated MEMS devices.

The embodiments and examples set forth herein are presented in order to best explain the present invention and its practical application and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. Many modifications and variations are possible in light of the above teaching without departing from the spirit and scope of the following claims.

What is claimed is:

1. A micro-electro-mechanical device, comprising:

a mono-crystalline silicon wafer having movable elements fabricated thereto; and an epoxy adhesive layer bonding said mono-crystalline silicon wafer to a substrate wafer, wherein said movable elements comprise capacitors for detecting acceleration forces parallel and perpendicular to the surface of said silicon wafer.

\* \* \* \* \*